US006590805B2

(12) United States Patent
Lu et al.

(10) Patent No.: US 6,590,805 B2
(45) Date of Patent: Jul. 8, 2003

(54) MAGNETO-RESISTIVE MEMORY HAVING SENSE AMPLIFIER WITH OFFSET CONTROL

(75) Inventors: Yong Lu, Plymouth, MN (US); Michael F. Dries, Chanhassen, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/293,797

(22) Filed: Nov. 12, 2002

(65) Prior Publication Data

US 2003/0067801 A1 Apr. 10, 2003

Related U.S. Application Data

(63) Continuation of application No. 10/002,071, filed on Oct. 31, 2001, now Pat. No. 6,487,111, which is a continuation of application No. 09/618,256, filed on Jul. 17, 2000, now Pat. No. 6,396,733.

(51) Int. Cl.[7] .............................................. G11C 11/15
(52) U.S. Cl. .......................... 365/158; 365/207; 327/52
(58) Field of Search ................................ 365/158, 157, 365/207; 327/52

(56) References Cited

U.S. PATENT DOCUMENTS

| 3,573,485 A | 4/1971 | Ballard ........................ 365/154 |
| 4,132,904 A | 1/1979 | Harari ......................... 365/154 |
| 4,151,429 A * | 4/1979 | Hupe ............................ 327/52 |
| 4,553,053 A | 11/1985 | Ong et al. .................... 365/196 |
| 4,731,757 A | 3/1988 | Daughton et al. ........... 365/158 |
| 4,751,677 A | 6/1988 | Daughton et al. ........... 365/158 |
| 4,829,476 A | 5/1989 | Dupuis et al. ............... 365/158 |
| 4,887,236 A | 12/1989 | Schloemann ................ 365/173 |
| 5,349,302 A | 9/1994 | Cooper ........................ 365/207 |
| 5,361,226 A | 11/1994 | Taguchi et al. ............. 365/171 |
| 5,434,826 A | 7/1995 | Ravipati et al. ............ 365/140 |
| 5,515,314 A | 5/1996 | Kouhei et al. .............. 365/158 |
| 5,587,943 A | 12/1996 | Torok et al. ................ 365/158 |
| 5,595,830 A | 1/1997 | Daughton ................... 428/611 |
| 5,640,343 A | 6/1997 | Gallagher et al. .......... 365/171 |
| 5,650,887 A | 7/1997 | Dovek et al. ................. 360/75 |
| 5,650,958 A | 7/1997 | Gallagher et al. .......... 365/173 |
| 5,654,566 A | 8/1997 | Johnson ...................... 257/295 |
| 5,695,864 A | 12/1997 | Slonczewski ............... 428/212 |
| 5,701,222 A | 12/1997 | Gill et al. .................... 360/113 |
| 5,701,223 A | 12/1997 | Fontana, Jr. et al. ........ 360/113 |
| 5,748,519 A | 5/1998 | Tehrani et al. ................ 365/98 |
| 5,776,537 A | 7/1998 | Ryan et al. ..................... 427/8 |
| 5,801,529 A | 9/1998 | Unemoto et al. ....... 324/207.12 |
| 5,861,328 A | 1/1999 | Tehrani et al. .............. 438/210 |
| 5,936,882 A * | 8/1999 | Dunn .......................... 365/158 |
| 6,256,247 B1 * | 7/2001 | Perner ......................... 365/158 |
| 6,388,917 B2 * | 5/2002 | Hoffmann et al. .......... 365/158 |

FOREIGN PATENT DOCUMENTS

| EP | 0 776 011 A2 | 5/1997 |
| WO | WO 98/20496 | 5/1997 |

OTHER PUBLICATIONS

B. Razavi and B.A. Wooley, "Design Techniques for High Speed, High Resolution Comparators", *IEEE Journal of Solid State Circuits*, vol. 27, pp. 1916–1926, Dec. 1992.

* cited by examiner

Primary Examiner—Tan T. Nguyen
(74) Attorney, Agent, or Firm—Knobbe, Martens, Olson & Bear, LLP

(57) ABSTRACT

A magneto-resistive memory is disclosed that includes a high-speed sense amplifier, that can reliably operate at low signal levels. The sense amplifier includes offset cancellation to reduce or eliminate the internal offsets of the amplifier. The offset cancellation is controlled by one or more switches, which during operation, selectively enable the offset cancellation of the amplifier and store the offsets in one or more coupling capacitors.

13 Claims, 13 Drawing Sheets

MAGNETO-RESISTIVE MEMORY HAVING SENSE AMPLIFIER WITH OFFSET CONTROL

CROSS-REFERENCE TO RELATED CO-PENDING APPLICATIONS

This Application is a continuation of allowed U.S. patent application Ser. No. 10/002,071, filed Oct. 31, 2001 now U.S. Pat. No. 6,487,111, which in turn is a continuation of application Ser. No. 09/618,256, filed Jul. 17, 2000, now U.S. Pat. No. 6,396,733 issued May 28, 2002 and entitled "MAGNETO-RESISTIVE MEMORY HAVING SENSE AMPLIFIER WITH OFFSET CONTROL." This Application is further related to U.S. patent application Ser. No. 09/618,237 filed Jul. 18, 2000 now U.S. Pat. No. 6,493,258 and entitled "MAGNETO-RESISTIVE MEMORY ARRAY", and U.S. patent application Ser. No. 09/638,415 filed Aug. 14, 2000 now U.S. Pat. No. 6,363,007 and entitled "MAGNETO-RESISTIVE MEMORY WITH SHARED WORDLINE AND SENSE LINE", both of which are incorporated herein by reference.

BACKGROUND OF THE INVENTION

The present invention relates generally to magneto-resistive memory devices, and more particularly, to sense amplifiers for magneto-resistive memory devices.

Digital memories of various kinds are used extensively in computer and computer system components, in digital processing systems and the like. One such kind of memory can be formed, to considerable advantage, based on the storage of digital bits as alternative states of magnetization in magnetic materials in each memory cell, typically thin film materials. In ferromagnetic thin film memories, the states of the memory cells based on magnetization direction are determined through magneto-resistive properties of the thin film. To read the state of a ferromagnetic thin film memory, a sense current is typically provided through the ferromagnetic thin film elements of a selected memory cell, and a resulting voltage signal is sensed by an electronic circuit such as a sense amplifier.

The magneto-resistance of a ferromagnetic thin film element typically only changes a few percent when exposed to a magnetic field. Accordingly, the resulting signal level generated when a sense current is passed through the ferromagnetic thin film element is typically quite small. Many sense amplifiers cannot reliably operate at these low signal levels for a variety of reasons including the internal offsets of the amplifier, noise, etc. To compensate for these limitations, the sense current must often be increased to increase the signal levels that are produced and provided to the sense amplifier. This, however, increases the power and sometimes reduces the speed of the memory, particularly for memory architectures where multiple memory cells are accessed simultaneously. Accordingly, a need exists for a high-speed sense amplifier that reliably operates at low signal levels, and in particular, those signal levels that are produced by magneto-resistive memory devices.

SUMMARY OF THE INVENTION

The present invention overcomes many of the disadvantages of the prior art by providing a magneto-resistive memory that includes a high-speed sense amplifier that can reliably operate at low signal levels. To achieve this, the sense amplifier includes offset cancellation to reduce or eliminate the internal offsets of the amplifier. The offset cancellation is preferably controlled by one or more switches, which during operation, selectively enable the offset cancellation of the amplifier and store the offsets in one or more coupling capacitors.

In one illustrative embodiment of the present invention, a magneto-resistive memory is provided that has a first magneto-resistive bit with a first end and a second end and a second magneto-resistive bit with a first end and a second end. The first end of the first magneto-resistive bit is coupled to a first bit line and the first end of the second magneto-resistive bit is coupled to a second bit line. The second end of the first magneto-resistive bit and the second end of the second magneto-resistive bit are selectively coupled to a predetermined reference voltage such as ground via one or more selection switches. The selection switches allow one or more memory cells to be selected during a read or write operation.

The first magneto-resistive bit and the second magneto-resistive bit are preferably written into opposite resistive states. Thus, when a sense current is provided to the first and second bit lines, and the one or more selection switches are enabled to ground the second end of the first magneto-resistive bit and the second magneto-resistive bit, a differential voltage is generated between the first bit line and the second bit line. The sense amplifier then senses and amplifies this differential voltage.

The offset cancellation of the sense amplifier can be achieved in a variety of ways. In an input offset storage embodiment, one or more coupling capacitors couple the differential voltage from the first and second bit lines to the inputs of a differential amplifier. During offset cancellation, one or more switches selectively connect the inputs of the differential amplifier to the outputs of the differential amplifier. Also, the inputs of the one or more coupling capacitors are disconnected from the first and second bit lines, and connected to a predetermined reference voltage such as ground. In this configuration, a charge is stored on the one or more coupling capacitors that compensates for internal offsets of the amplifier.

Once the coupling capacitors are charged, the offset cancellation is disabled. When the offset cancellation is disabled, the inputs of the differential amplifier are disconnected from the outputs of the differential amplifier, and the inputs of the one or more coupling capacitors are connected to the first and second bit lines of the magneto-resistive memory. Because the internal offsets of the differential amplifier are already stored on the coupling capacitors, the resulting output signal of the differential amplifier is substantially free of the internal offsets, thereby allowing the reliable amplification of relatively small signals.

Instead of connecting the coupling capacitors to a predetermined reference voltage during offset cancellation, it is contemplated that a differential voltage having the opposite polarity to the differential voltage between the first and second bit lines may be provided to the coupling capacitors. This may cause the coupling capacitors to store a charge that not only cancels out the internal offsets of the differential amplifier, but also includes a charge that corresponds to the opposite polarity of the desired differential voltage signal. Once the offset cancellation is disabled, the differential voltage generated between the first and second bit lines is provided to the coupling capacitors. This embodiment may produce about a two times amplification in the differential voltage signal, as seen at the inputs of the differential amplifier, thereby further increasing the ability of the sense amplifier to reliably amplify small signals.

In an output offset storage embodiment, the one or more coupling capacitors are coupled to the outputs of the differential amplifier. Further, the one or more switches that enable the offset cancellation selectively connect the output of the coupling capacitors to a predetermined reference voltage such as ground, and selectively connect the inputs of the differential amplifier to a predetermined voltage such as ground. In this configuration, and like above, a charge is stored on the one or more coupling capacitors that corresponds to the internal offsets of the amplifier.

Once the coupling capacitors are charged, the offset cancellation may be disabled, which disconnects the outputs of the coupling capacitors from the predetermined reference voltage, and disconnects the inputs of the differential amplifier from the predetermined reference voltage. The inputs of the differential amplifier are also connected to the first and second bit lines of the magneto-resistive memory. Because the internal offsets of the differential amplifier are already stored on the coupling capacitors, the resulting output signal at the output of the coupling capacitors is substantially free of the internal offsets, thereby allowing the reliable amplification of relatively small signals.

Instead of connecting the outputs of the coupling capacitors to a predetermined reference voltage during offset cancellation, it is contemplated that a differential voltage having the opposite polarity of the differential voltage generated between the first and second bit lines may be provided to the coupling capacitors. The differential voltage having the opposite polarity of the differential voltage generated between the first and second bit lines may also be provided to the inputs of the differential amplifier. This may cause the coupling capacitors to store a charge that not only cancels out the internal offsets of the differential amplifier, but also includes a charge that corresponds to the opposite polarity of the desired differential voltage. Once the offset cancellation is disabled, the differential voltage generated between the first and second bit lines may be provided to the inputs of the differential amplifier. This may produce about a two times amplification in the differential voltage, as seen at the outputs of the coupling capacitors, thereby further increasing the ability of the sense amplifier to reliably amplify small signals.

The output of the sense amplifier is preferably provided to a storage element, such as a latch. The latch may store the data state read from the magneto-resistive memory. In an illustrative embodiment, the latch includes a pair of cross-coupled inverters, where each of the cross-coupled inverters has an input terminal, an output terminal, a power supply terminal and a ground terminal. A pair of switches are provided for selectively disconnecting the power supply terminal from a power supply voltage and/or the ground terminal from ground. The illustrative latch further includes at least one switch for selectively connecting the output of the sense amplifier to at least one of the output terminals of the cross-coupled inverters. Finally, the illustrative latch further includes a reset switch for selectively connecting together the output terminals of the cross-coupled inverters.

During operation, a control block selectively disconnects the power supply terminal and the ground terminal (collectively called the power supply terminals) of each of the cross-coupled inverters. The control block then enables the at least one switch of the latch to allow the output signal of the amplifier to set the voltage levels of at least one of the output terminals of the cross-coupled inverters. The control block then disables the at least one switch of the latch to prevent the output signal of the amplifier from setting the voltage levels of the output terminals of the cross-coupled inverters. The control block then connects the power supply terminals of each of the cross-coupled inverters of the latch, which sets the latch to desired state. The desired state is preferably read from the latch. The control block again disconnects the power supply terminals of each of the cross-coupled inverters. Finally, the control block resets the state of the latch by selectively connecting the output terminals of the cross-coupled inverters via the reset switch of the latch.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 2:
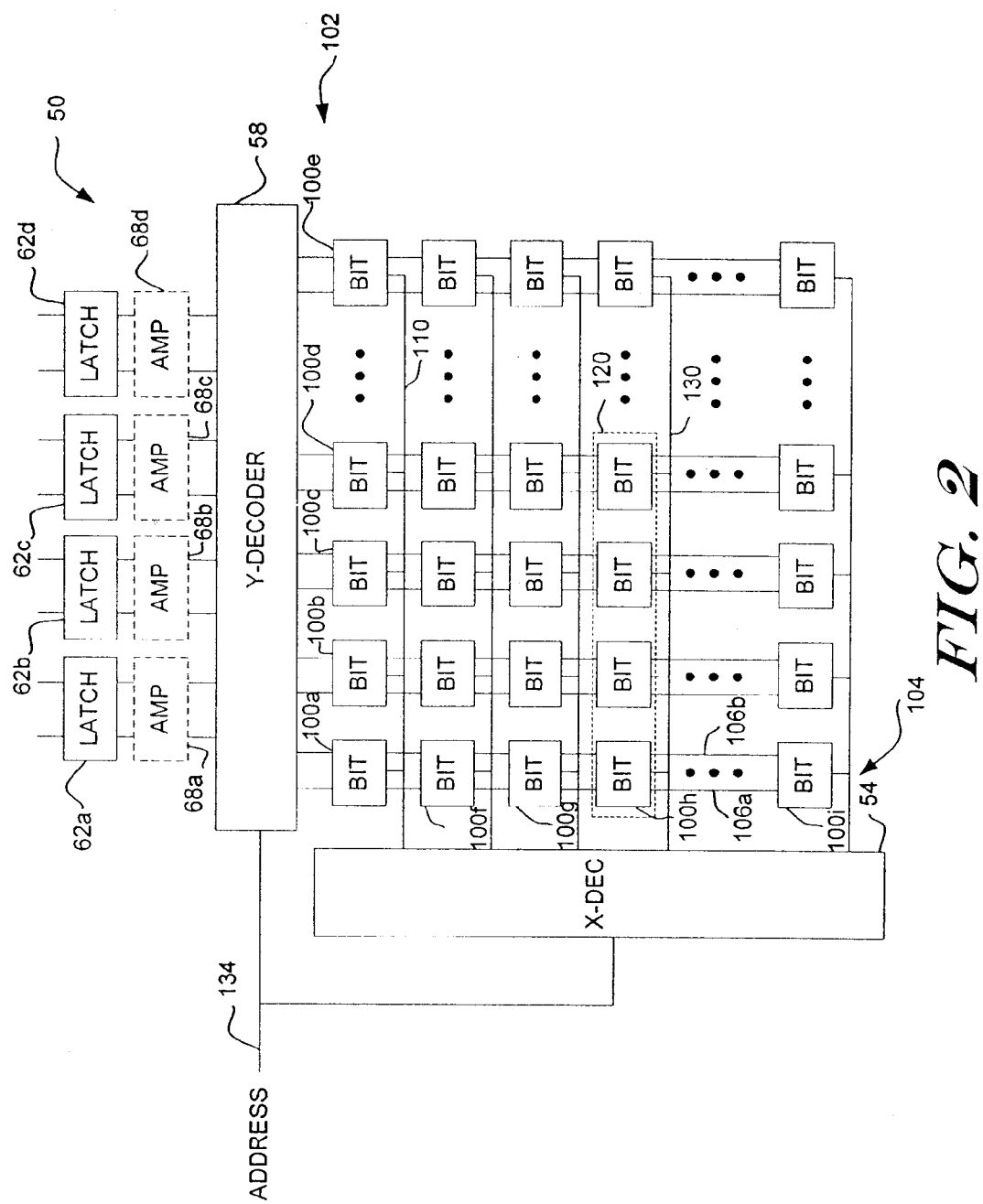
FIG. 2 is a schematic diagram showing an illustrative magneto-resistive memory in accordance with the present invention.

FIG. 2 is a schematic diagram showing an illustrative magneto-resistive memory in accordance with the present invention. The basic memory architecture is generally shown at 50 and includes an array of memory cells 100, a x-decoder 54, a y-decoder 58, one or more latches 62, and one or more sense amplifier 68. The x-decoder 54, y-decoder 58 and sense amplifier 68 are optional, at least for some embodiments.

The memory cells 100 are arranged into a number of rows and a number of columns. One row is shown at 102, and includes memory cells 100*a*, 100*b*, 100*c*, 100*d* and 100*e*. One column is shown at 104, and includes memory cells 100a, 100f, 100g, 100h and 100i. Each column has at least one, but preferably two, bit lines associated therewith. For example, column 104 has bit lines 106a and 106b. Likewise, each row preferably has at least one select line associated therewith. The select lines are preferably used to select a desired row of memory cells. For example, row 102 has select line 110.

The bit lines for each column of the memory array are preferably provided to y-decoder 58. Y-decoder 58 selects the bit line pairs of selected columns, and provides the selected bit line pairs to latch elements 62. In some embodiments, and as described below, the Y-decoder 58 provides the selected bit line pairs to latch elements 62 via amplifiers 68. The illustrative memory is a X4 configuration. Thus, the y-decoder 58 selects four bit line pairs, and couples the selected four bit line pairs to the four latch elements 62a, 62b, 62c and 62d. Likewise, the select lines for each row of memory cells are preferably provided to x-decoder 54. The x-decoder 54 preferably selects one row of memory cells. In the illustrative embodiment, the y-decoder 58 and the x-decoder 54 are controlled by a memory address 134.

In one embodiment, and to read the four bits identified at 120, the y-decoder 58 preferably couples the bit lines of columns 104, 122, 124 and 126 to latches 62a, 62b, 62c and 62d, respectively, and the x-decoder 54 asserts select line 130. This causes the each of the four bits 120 to be enabled, with the corresponding bit lines coupled to the four latches 62a, 62b, 62c and 62d.

It is recognized that in some embodiments, the y-decoder 58 may not be needed, and the bit line pairs may be directly coupled to a corresponding latch element. Likewise, the x-decoder 54 may not be needed, and the select line may be directly controlled by, for example, an address bit.

It is sometimes advantageous to provide a sense amplifier between the selected bit lines and the latch elements. In the illustrative diagram, the sense amplifiers are shown in dotted lines at 68a, 68b, 68c and 68d indicating that they are optionally used in some embodiments. The sense amplifiers 68a, 68b, 68c and 68d amplify the signals on the bit lines before providing an amplified signal to the latches. This may be particularly beneficial when relatively small sense currents are provided to the magneto-resistive bits to save power. Illustrative sense amplifiers are shown and described below with respect to FIGS. 7–13.

Figure 3:
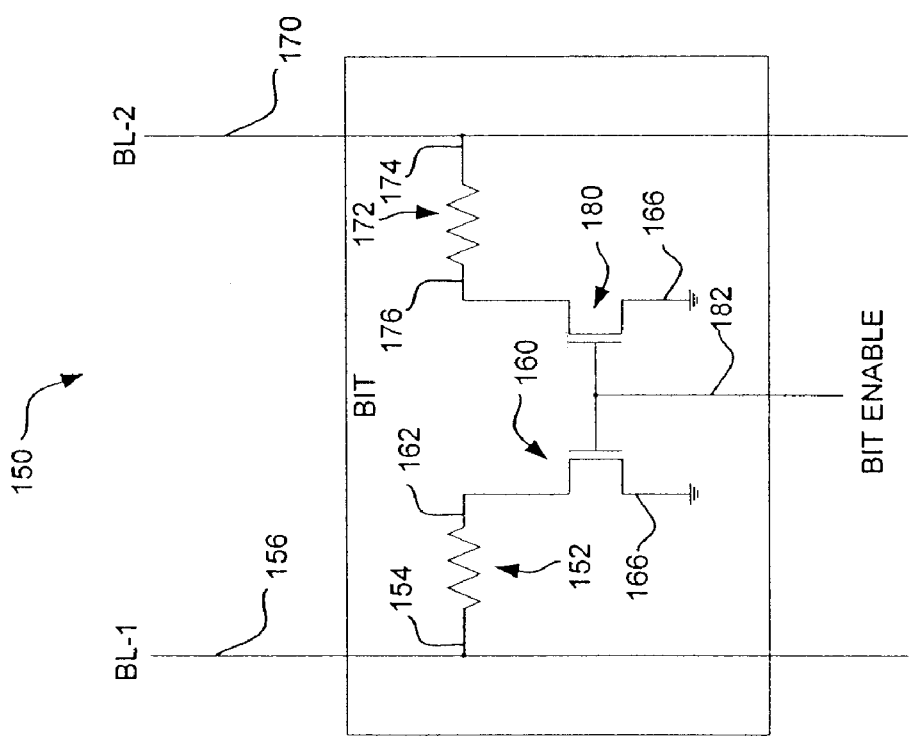
FIG. 3 is a schematic diagram showing an illustrative memory cell in accordance with the present invention.

FIG. 3 is a schematic diagram showing an illustrative memory cell in accordance with the present invention. The memory cell is generally shown at 150, and includes at least one magneto-resistive bit 152. A first end 154 of the magneto-resistive bit 152 is connected to a bit line 156. A switch 160 is coupled to the second end 162 of the magneto-resistive bit 152. The switch 160 selectively provides a path for a sense current to flow from the bit line 156, through at least part of the magneto-resistive bit 152, and to a first predetermined voltage terminal 166, such as ground. In the illustrative embodiment shown, the switch 160 is an n-channel transistor.

To read the memory cell 150, a sense current is provided to the bit line 156, and the switch 160 is enabled. By activating the switch 160, the sense current provided on bit line 156 flows through the magneto-resistive bit 152 and to the predetermined voltage terminal 166 (e.g. ground). The switch 160 provides selectivity between rows of memory cells in a magneto-resistive memory array, such as memory 50 shown in FIG. 2. The sense current produces a voltage on bit line 156 that reflects the resistive state of the magneto-resistive bit 152. A sense amplifier (see FIG. 2) may be used to sense and amplify the voltage on the bit line 156.

In another embodiment, the memory cell 150 may be coupled to two bit lines 156 and 170, and include two magneto-resistive bits 152 and 172 as shown. The magneto-resistive bits 152 and 172 are preferably written into opposite resistive states. Like above, the first end 154 of the first magneto-resistive bit 152 is connected to the first bit line 156. The first end 174 of the second magneto-resistive bit 172 is connected to the second bit line 170. The memory cell also includes a switch that is coupled to the second end 162 of the first magneto-resistive bit 152 and the second end 176 of the second magneto-resistive bit 172. The switch selectively provides a path for a first sense current to flow from the first bit line 156, through the first magneto-resistive bit 152, and to a predetermined voltage terminal 166. The switch also may selectively provide a path for a second sense current to flow from the second bit line 170, through the second magneto-resistive bit 172, and to the predetermined voltage terminal 166.

In this illustrative embodiment, the memory cell is read by providing a first sense current to the first bit line and a second sense current to the second bit line. The first sense current is preferably substantially identical to the second sense current. Thereafter, the switch of the selected memory cell is enabled. This allows the first sense current to flow through the first magneto-resistive bit 152 to produce a first voltage on the first bit line 156, and allows the second sense current to flow through the second magneto-resistive bit 172 to produce a second voltage on the second bit line 170. In the illustrative embodiment shown, the switch includes a first n-channel transistor 160 and a second n-channel transistor 180, with the gates of the first and second n-channel transistors 160 and 180 connected to a bit enable terminal 182. A sense amplifier may then be used to sense and amplify a differential voltage between the first bit line 156 and the second bit lines 170.

It is contemplated that each of the memory cells of FIG. 2 may be implemented similar to that shown in FIG. 3. For example, if memory cell 100a of FIG. 2 is implemented similar to that shown in FIG. 3, the first bit line 156 and the second bit line 170 of FIG. 3 may correspond to bit lines 106a and 106b of FIG. 2. Likewise, the bit enable terminal 182 of FIG. 3 may be connected to the row select line 110 of FIG. 2.

Figure 4:
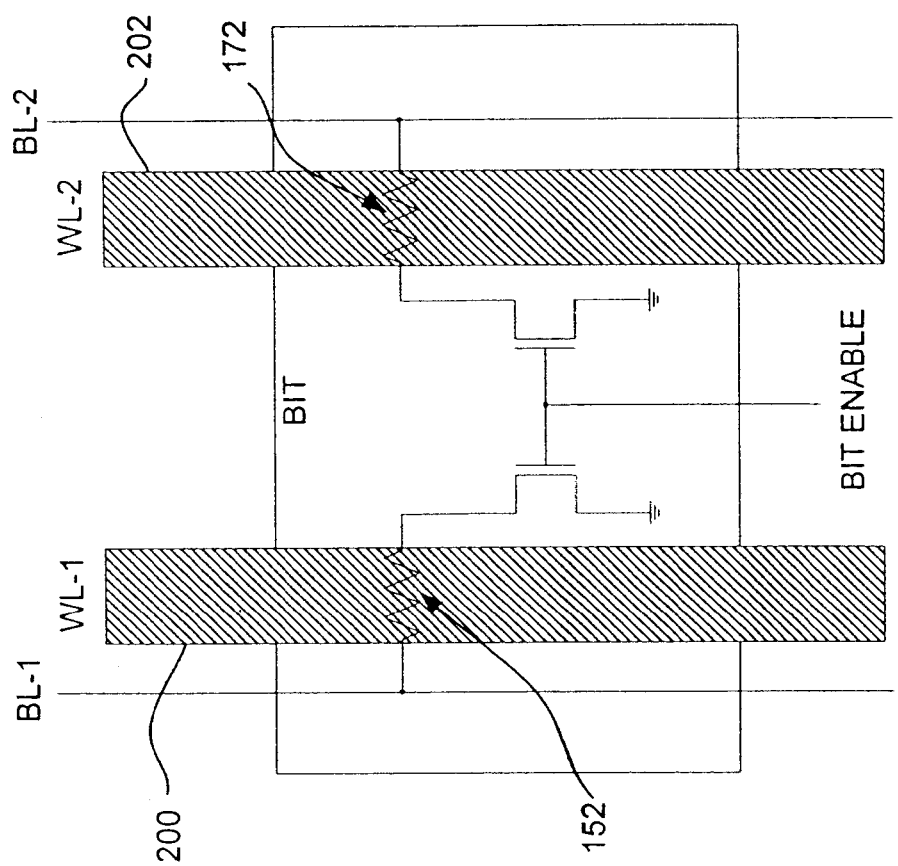
FIG. 4 is a schematic diagram showing the illustrative memory cell of FIG. 3, with two separate word lines overlaying the magneto-resistive bits.

FIG. 4 is a schematic diagram showing the illustrative memory cell of FIG. 3, with two separate word lines overlaying the magneto-resistive bits 152 and 172. As indicated above, the magneto resistive bits 152 and 172 are preferably written into opposite resistive states. This may be accomplished in a variety of ways, including for example, providing a first word line 200 adjacent, and transverse to the orientation of, the first magneto-resistive bit 152, and a second word line 202 adjacent, and transverse to the orientation of, the second magneto-resistive bit 172.

If the magnetization vector of the pinned (or hard) layer of the magneto-resistive elements 152 and 172 points in a common direction, such as to the right, the magneto-resistive elements 152 and 172 can be written into opposite resistive states by providing a word line current down the first word line 200 and up the second word line 202, or up the first word line 200 and down the second word line 202, depending on the desired state to be written. If the magnetization vector of the pinned (or hard) layer of magneto-resistive element 152 points in an opposite direction to the pinned (or hard) layer of magneto-resistive element 172, a word line current may be provided down the first and second word lines 200 and 202, or up the first and second word lines 200 and 202, depending on the desired state to be written.

Figure 5:
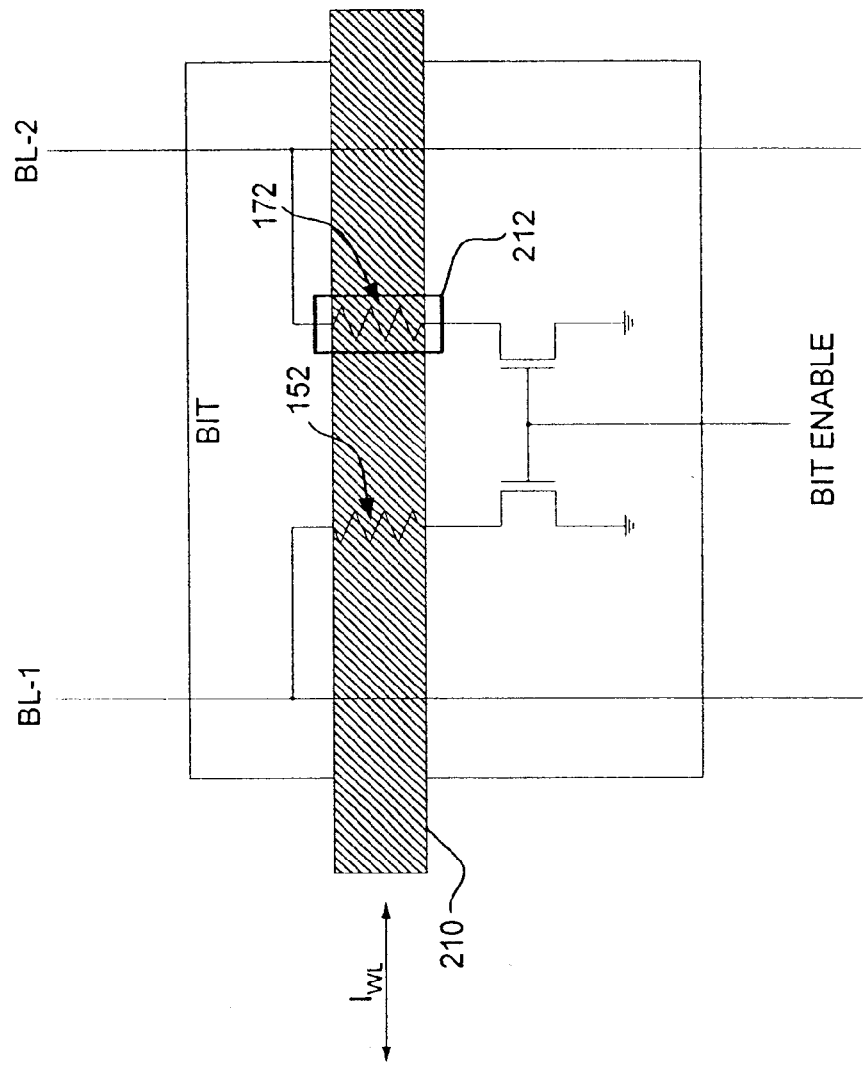
FIG. 5 is a schematic diagram showing the illustrative memory cell of FIG. 3, with one word lines passing over one of the magneto-resistive bits and under the other.

FIG. 5 is a schematic diagram showing the illustrative memory cell of FIG. 3, with a word line 210 extending over, and transverse to, the orientation of the first magneto-resistive bit 152, and under, and transverse to, the orientation of the second magneto-resistive bit 172. Box 212 indicates that the second magneto-resistive bit 172 is above word line 210.

In this configuration, the magnetization vectors of the pined (or hard) layers of the magneto-resistive elements 152 and 172 preferably point in a common direction, such as in an upward or downward direction. A word line current provided through the word line 210 changes the magnetization vector of the free (or soft) layer of magneto-resistive bit 152 to point in one direction, and the free (or soft) layer of magneto-resistive bit 172 to point in the opposite direction. Accordingly, the first and second magneto-resistive bits 152 and 172 may be written into opposite resistive states.

Figure 6:
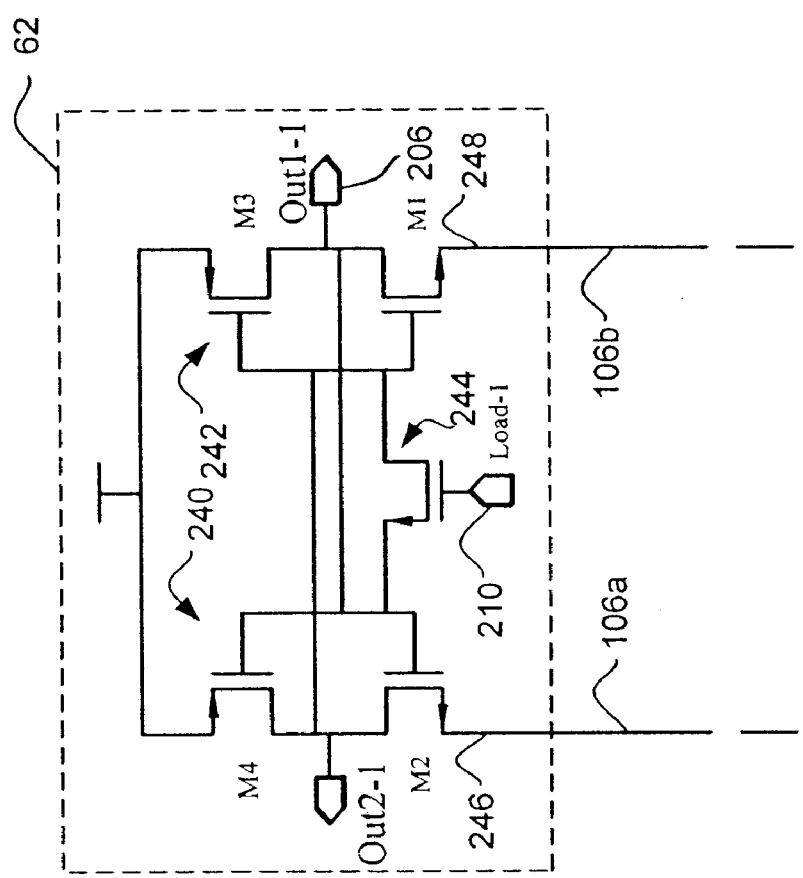
FIG. 6 is a schematic diagram of a first illustrative latch in accordance with the present invention.

FIG. 6 is a schematic diagram of a first illustrative latch in accordance with the present invention. The latch of FIG. 6 is one illustrative implementation for the latch elements 62a, 62b, 62c and 62d of FIG. 2. This implementation is typically used when the sense amplifiers 68a, 68b, 68c and 68d of FIG. 2 are not used. The illustrative latch 62a includes a first inverter 240 and a second inverter 242 coupled together in a cross-coupled configuration. The latch preferably includes a load transistor 244 coupled between the input (or output) terminals of the first and second inverters. The load transistor 244 is used to load the state present on the negative supply terminals 246 and 248 of the first and second inverters 240 and 242, respectively.

A first bit line, such as bit line 106a of FIG. 2, is coupled to the negative supply terminal 246 of the first inverter 240. Likewise, a second bit line, such as bit line 106b of FIG. 2, is coupled to the negative supply terminal 248 of the second inverter 242. When a particular memory cell is selected, a first end 154 of a first magneto-resistive bit 152 (see FIG. 3) is thus coupled to the negative supply terminal 246 of the first inverter 240 via the first bit line 106a, and a first end 174 of a second magneto-resistive bit 172 is coupled to the negative supply terminal 248 of the second inverter 242 via the second bit line 106b. During a read operation, the second ends 162 and 176 of the first and second magneto-resistive bits 152 and 172, respectively, are also coupled to ground via switches 160 and 180 or the like, as described above.

When the load transistor 244 of the latch is activated, identical sense line currents are provided to the first bit line 106a and the second bit line 106b via the negative supply terminals 246 and 248 of the first and second inverters 240 and 242. With the switches 160 and 180 in the memory cell enabled, for example via select-1 line 110 of FIG. 2, the first and second sense line currents pass through the first and second magneto-resistive bits 152 and 172, respectively, to ground. Since the first and second magneto-resistive bits 152 and 172 are in opposite resistive states, the voltages at the bit lines, and thus the negative supply terminals 246 and 248 of the latch, are not equal. When the load transistor 244 is deactivated, the latch circuit assumes the state that corresponds to the voltage differential between the negative supply terminals 246 and 248 of the first and second inverters 240 and 242. This state corresponds to the resistive state of the magneto-resistive bits 152 and 172.

Figure 1:
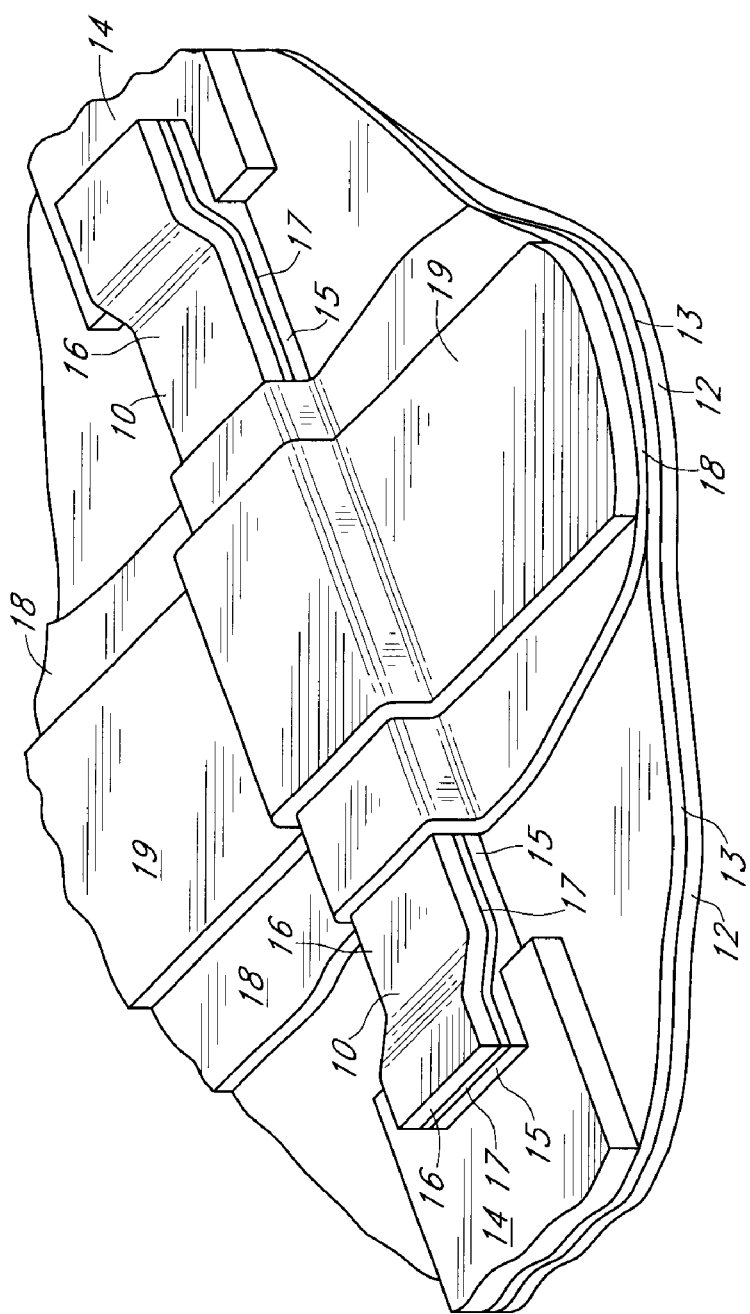
FIG. 1 is a partial cut-away perspective view of a prior art magneto-resistive memory.
Figure 7:
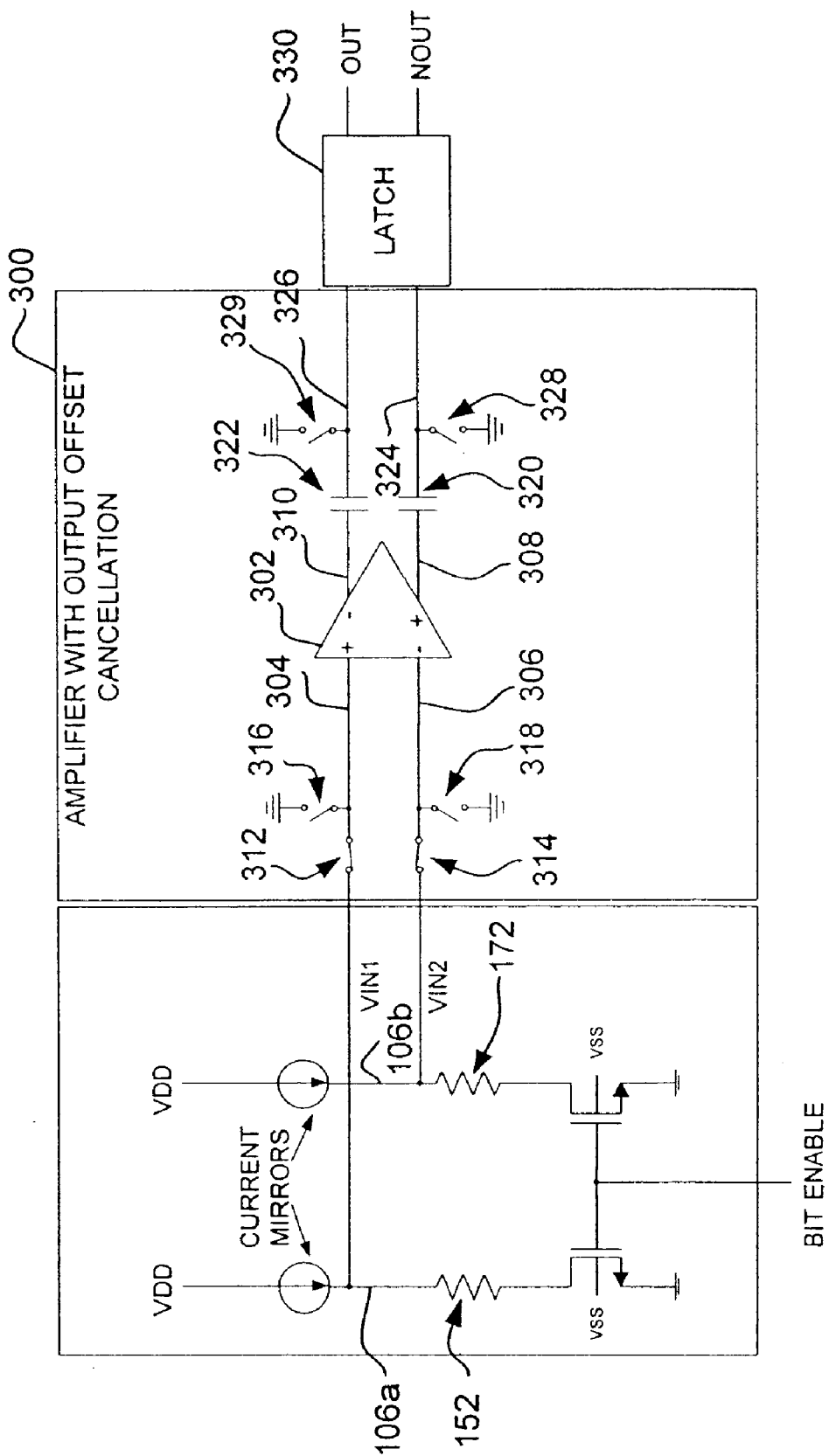
FIG. 7 is a schematic diagram showing a first illustrative sense amplifier in accordance with the present invention.

FIG. 7 is a schematic diagram showing a first illustrative sense amplifier in accordance with the present invention. As indicated above with respect to FIG. 1, it is often desirable to provide a sense amplifier between the selected bit lines and a corresponding latch. The use of a sense amplifier may allow lower sense currents to be used. The lower sense currents produce a smaller signal on the bit lines. This sense amplifier may amplify this smaller signal before providing the signal to the latch.

The illustrative sense amplifier is shown generally at 300, and includes offset cancellation to reduce or eliminate the internal offsets of the differential amplifier 302. The offset cancellation of the amplifier is preferably controlled by one or more switches, which during operation, selectively enable the offset cancellation of the amplifier and store the offsets in one or more coupling capacitors.

FIG. 7 shows a sense amplifier that uses output offset cancellation. That is, the offsets of the differential amplifier 302 are stored on one or more coupling capacitors that are coupled to the outputs of the differential amplifier 302. The differential amplifier includes a first input terminal 304, a second input terminal 306, a first output terminal 308 and a second output terminal 310. The first input terminal 304 is selectively coupled to a first bit line, such as first bit line 106a of FIG. 2, via switch 312. Likewise, the second input terminal 306 is selectively coupled to a second bit line, such as second bit line 106b of FIG. 2, via switch 314. The first input terminal 304 is also selectively coupled to a predetermined reference voltage such as ground via switch 316, and the second input terminal 306 is selectively coupled to the predetermined reference voltage such as ground via switch 318.

A first coupling capacitor 320 is coupled to the first output terminal 308 and a second coupling capacitor 322 is coupled to the second output terminal 310, as shown. The output 324 of the first coupling capacitor 320 is coupled to a first input of latch 330, and is further selectively coupled to a predetermined reference voltage such as ground via switch 328. Likewise, the output 326 of the second coupling capacitor 322 is coupled to a second input of latch 320, and is further coupled to a predetermined reference voltage such as ground via switch 329.

During offset cancellation, switches 316 and 318 are closed, thereby coupling the first input 304 and second input 306 to ground. Switches 328 and 329 are also closed, thereby coupling the output 324 of the first coupling capacitor 320 and the output 326 of the second coupling capacitor 322 to ground. Finally, switches 312 and 314 are opened to disconnect the first and second inputs 304 and 306 from the bit lines 106a and 106b. In this configuration, a charge is stored on the first and second coupling capacitors 320 and 322 that corresponds to the internal offsets of the differential amplifier 302.

Once the coupling capacitors are charged, the offset cancellation may be disabled. Disabling the offset cancellation opens switches 316, 318, 328 and 329, thereby disconnecting the outputs 324 and 326 of the coupling capacitors 320 and 322 from ground, and disconnecting the inputs 304 and 306 of the differential amplifier 302 from ground. Disabling the offset cancellation also closes switches 312 and 314, which connects the inputs 304 and 306 of the differential amplifier 302 to the first and second bit lines 106a and 106b. Because the internal offsets of the differential amplifier 302 are already stored on the coupling capacitors 320 and 322, the resulting output signal at the outputs 324 and 326 of the coupling capacitors 320 and 322 is substantially free of internal offsets, thereby allowing the reliable amplification of relatively small signal levels.

Instead of connecting the outputs 324 and 326 of the coupling capacitors 320 and 322 to a predetermined reference voltage such as ground during offset cancellation, it is contemplated that a differential voltage having the opposite polarity of the differential voltage generated between the first bit line 106a and the second bit line 106b may be provided to the outputs 324 and 326 of the coupling capacitors 320 and 322 via switches 328 and 329, respectively. The differential voltage having the opposite polarity of the differential voltage generated between the first bit line 106a and the second bit line 106b may also be provided to the inputs 304 and 306 of the differential amplifier 302 via switches 316 and 318, respectively.

This may cause the coupling capacitors 320 and 322 to store a charge that not only cancels out the internal offsets of the differential amplifier 302, but also includes a charge that corresponds to the opposite polarity of the desired differential signal. Once the offset cancellation is disabled, the differential voltage generated between the first and second bit lines 106a and 106b may be provided to the inputs 304 and 306 of the differential amplifier 302 via switches 312 and 314, respectively. This may produce about a two times amplification in the differential voltage, as seen at the outputs 324 and 326 of the coupling capacitors 320 and 322, thereby further increasing the ability of the sense amplifier to reliably amplify small signal levels.

The output of the sense amplifier is preferably provided to a latch 330, as shown. The latch 330 may store the data state read from the magneto-resistive memory cell. In an illustrative embodiment, the latch includes a pair of cross-coupled inverters, where each of the cross-coupled inverters has an input terminal, an output terminal, a power supply terminal and a ground terminal. A pair of switches are provided for selectively disconnecting the power supply terminal from a power supply voltage and/or the ground terminal from ground. The latch 330 may further include at least one switch for selectively connecting the outputs 324 and 326 of the sense amplifier to the output terminals of the cross-coupled inverters. Finally, the illustrative latch may include a reset switch for selectively connecting together the output terminals of the cross-coupled inverters. One such latch is further described below with reference to FIG. 12.

Figure 8:
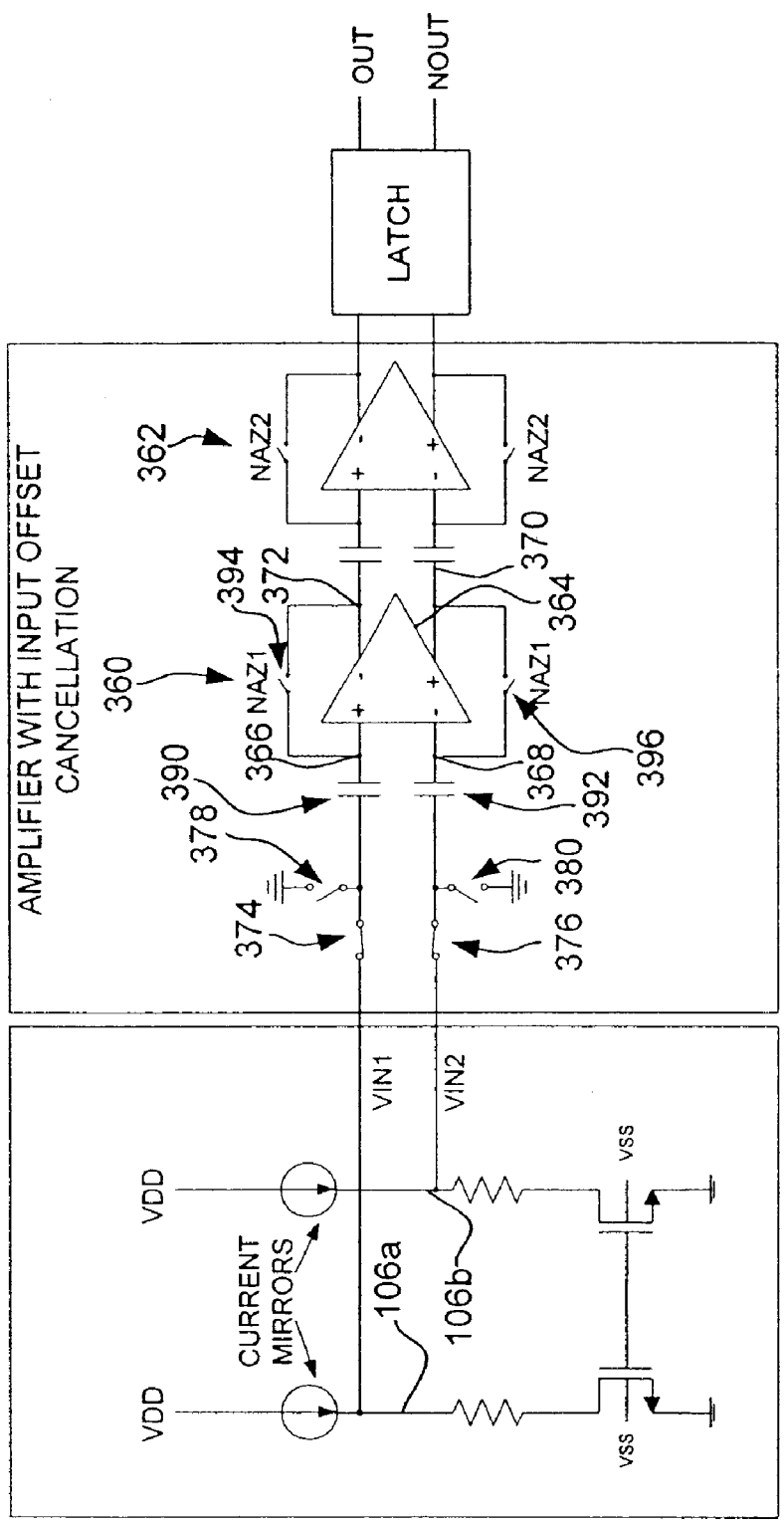
FIG. 8 is a schematic diagram showing a second illustrative sense amplifier in accordance with the present invention.

FIG. 8 is a schematic diagram showing a second illustrative sense amplifier in accordance with the present invention. A two stage sense amplifier is shown in FIG. 8, wherein each stage has input offset cancellation. Input offset cancellation indicates that the offsets of the amplifiers are stored on one or more coupling capacitors that are coupled to the inputs of each amplifier stage.

A first stage of the sense amplifier is shown at 360, and a second stage is shown at 362. The first stage includes a differential amplifier 364. Differential amplifier 364 includes a first input terminal 366, a second input terminal 368, first output terminal 370 and a second output terminal 372. The first input terminal 366 is coupled to a first coupling capacitor 390, and is further selectively coupled to the second output terminal 372 via switch 394. Likewise, the second input terminal 368 is coupled to a second coupling capacitor 392, and is further selectively coupled to the first output terminal 370 via switch 396.

Input 400 of the first coupling capacitor 390 is selectively coupled to a first bit line, such as first bit line 106a of FIG. 2, via switch 374. Likewise, input 402 of the second coupling capacitor 392 is selectively coupled to a second bit line, such as second bit line 106b of FIG. 2, via switch 376. The input 400 of the first coupling capacitor 390 is also selectively coupled to a predetermined reference voltage such as ground via switch 378, and the input 402 of the second coupling capacitor 392 is selectively coupled to a predetermined reference voltage such as ground via switch 380.

During offset cancellation, switch 394 is closed to connect the first input 366 of the differential amplifier 364 to the second output 372 of the differential amplifier 364, and switch 396 is closed to connect the second input 368 of the differential amplifier 364 to the first output 370 of the differential amplifier. Switches 394 and 396 are often called auto-zero switches because they provide an effective "zero" input level at the input of the differential amplifier 364. The effective "zero" input level is not usually a zero value, but rather a value that corresponds to the internal offsets of the differential amplifier 364.

Switches 378 and 380 are also closed to connect the inputs 400 and 402 of coupling capacitors 390 and 392 to a predetermined reference voltage such as ground. Finally, switches 374 and 376 are opened, to disconnect the inputs 400 and 402 of coupling capacitors 390 and 392 from the first and second bit lines 106a and 106b. In this configuration, a charge is stored on the coupling capacitors 390 and 392 that corresponds to the internal offsets of the differential amplifier 364.

Once the coupling capacitors are charged, the offset cancellation is disabled. Disabling the offset cancellation opens switches 378, 380, 394 and 396, thereby disconnecting the inputs 400 and 402 of the coupling capacitors 390 and 392 from ground, and disconnecting the inputs 366 and 368 of the differential amplifier 364 from the outputs 370 and 372 of the differential amplifier 364. Disabling the offset cancellation also closes switches 374 and 376, which connects the inputs 400 and 402 of the coupling capacitors 390 and 392 to the first and second bit lines 106a and 106b.

Because the internal offsets of the differential amplifier 364 are already stored on the coupling capacitors 390 and 392, the resulting output signal of the differential amplifier 364 is substantially free of the internal offsets, thereby allowing the reliable amplification of relatively small signal levels. The second stage 362 operates in a similar manner.

Instead of connecting the inputs 400 and 402 of the first and second coupling capacitors 390 and 392, respectively, to a predetermined reference voltage during offset cancellation, it is contemplated that a differential voltage having the opposite polarity to the differential voltage between the first and second bit lines 106a and 106b may be provided to the coupling capacitors 390 and 392. This may cause the coupling capacitors 390 and 392 to store a charge that not only cancels out the internal offsets of the differential amplifier 364, but also includes a charge that corresponds to the opposite polarity of the desired differential voltage signal. Once the offset cancellation is disabled, the differential voltage generated between the first and second bit lines 106a and 106b is provided to the inputs 400 and 402 of the coupling capacitors 390 and 392. This embodiment may produce about a two times amplification in the differential voltage signal, as seen at the inputs 366 and 368 of the differential amplifier 364, thereby further increasing the ability of the sense amplifier to reliably amplify small signals.

Figure 9:
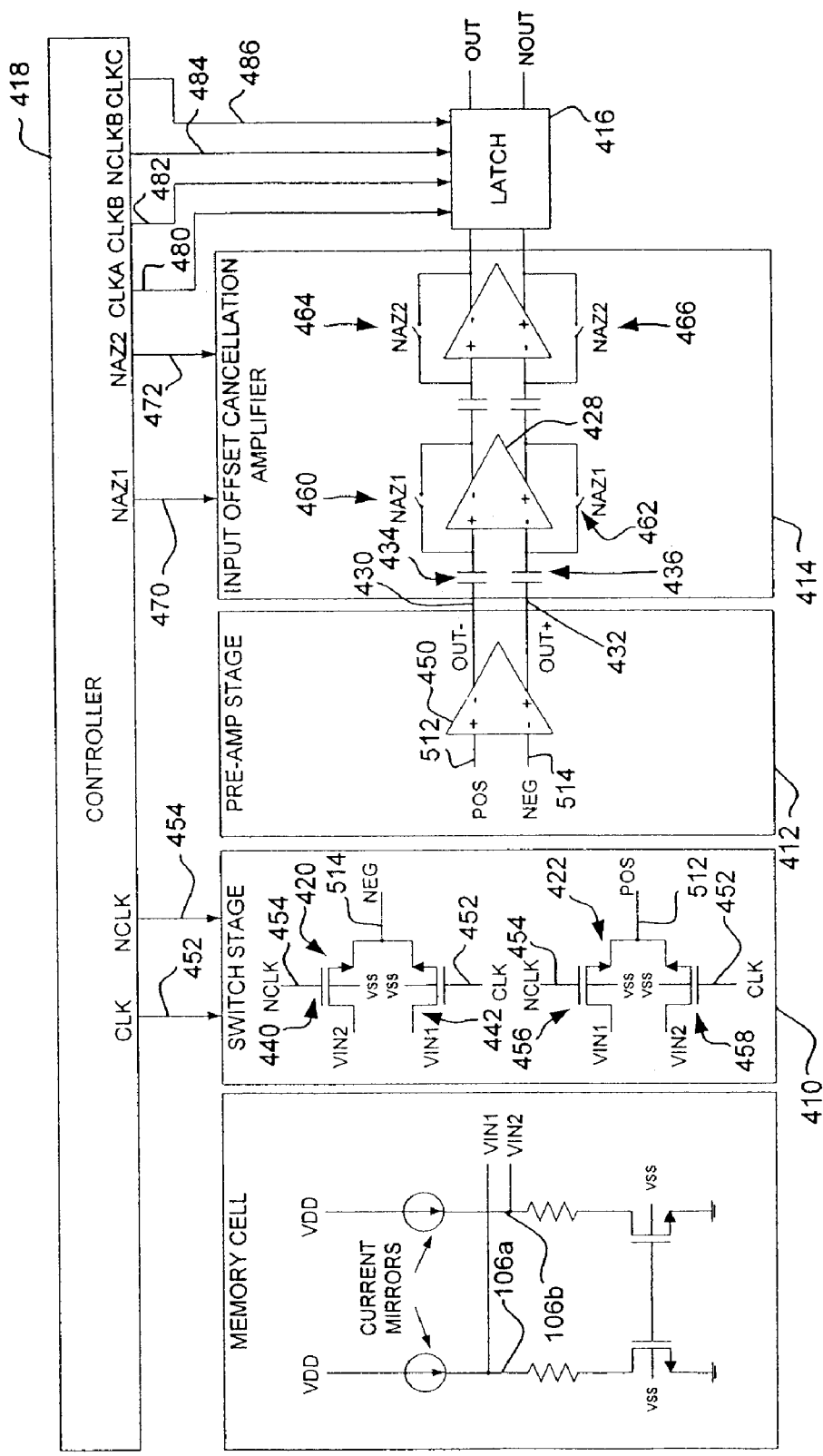
FIG. 9 is a schematic diagram showing a third illustrative sense amplifier in accordance with the present invention.

FIG. 9 is a schematic diagram showing a third illustrative sense amplifier in accordance with the present invention. This embodiment provides a differential voltage signal having the opposite polarity to the differential voltage between the first and second bit lines 106a and 106b to the coupling capacitors of the input offset cancellation amplifier 414 during offset cancellation. As indicated above, this may increase the amplification of the differential voltage signal, as seen at the inputs of the differential amplifier 428, which may further increasing the ability of the sense amplifier to reliably amplify small signals.

The illustrative sense amplifier includes a switch stage 410, a pre-amplifier stage 412, a two stage input offset cancellation amplifier 414, a latch 416 and a controller 418. The switch stage 410 includes two switching elements 420 and 422. The first switching element 420 includes two n-channel transistors 440 and 442, each having a source, a drain and a gate. The drain of n-channel transistor 442 is coupled to the first bit line 106a, and the drain of n-channel transistor 440 is coupled to the second bit line 106b. The source of n-channel transistor 440 is coupled to the source of n-channel transistor 442, both of which are coupled to the negative input terminal 514 of the differential amplifier 450. The gate of n-channel transistor 442 is controlled by a clock signal 452, and the gate of n-channel transistor 440 is controlled by an inverted clock signal 454. Thus, only one of the n-channel transistors 440 and 442 is on at any given time.

Like the first switching element 420, the second switching element 422 of the switch stage 410 includes two n-channel transistors 456 and 458, each having a source, a drain and a gate. The drain of n-channel transistor 456 is coupled to the first bit line 106a, and the drain of the n-channel transistor 458 is coupled to the second bit line 106b. The source of n-channel transistor 456 is coupled to the source of n-channel transistor 458, both of which are coupled to the positive input terminal 512 of the differential amplifier 450. The gate of n-channel transistor 456 is controlled by the inverted clock signal 454, and the gate of n-channel transistor 458 is controlled by the clock signal 452. Thus, only one of the n-channel transistors 456 and 458 is on at any given time.

When the clock signal 452 is high and the inverted clock signal 454 is low, the first switching element 420 provides the voltage on the first bit line 106a to the negative input terminal 514 of the differential amplifier 450 of the pre-amplifier stage 412. The second switching element 422 provides the voltage on the second bit line 106b to the positive input terminal 512 of the differential amplifier 450 of the pre-amplifier stage 412. When the clock signal 452 is low and the inverted clock signal 454 is high the first switching element 420 provides the voltage on the second bit line 106b to the negative input terminal 514 of the differential amplifier 450 of the pre-amplifier stage 412. The second switching element 422 provides the voltage on the first bit line 106a to the positive input terminal 512 of the differential amplifier 450 of the pre-amplifier stage 412.

Accordingly, the switch stage 410 can be used to selectively change the polarity of the differential signal received from the first and second bit lines 106a and 106b, before providing the differential signal to the pre-amplifier stage 412. The pre-amplifier stage 412 amplifies the differential signal provided by the switch stage 410, and provides an amplified differential signal to the inputs 430 and 432 of coupling capacitors 434 and 436 of the input offset cancellation amplifier 414.

As such, and during offset cancellation, the inputs 430 and 432 of the first and second coupling capacitors 434 and 436 are coupled to a differential voltage having the opposite polarity of the differential signal between the first and second bit lines 106a and 106b. This causes the coupling capacitors 434 and 436 to store a charge that not only cancels out the internal offsets of the differential amplifier 428, but also includes a charge that corresponds to the opposite polarity of the desired differential voltage signal.

When the offset cancellation is disabled, the differential voltage between the first and second bit lines 106a and 106b is amplified by the pre-amplifier stage 412 and provided to the inputs 430 and 432 of the coupling capacitors 434 and 436. That is, the polarity of the differential signal at the inputs of the coupling capacitors 434 and 436 is reversed. This produces about a two times amplification in the differential voltage signal, as seen at the inputs of the differential amplifier 428, which may further increase the ability of the sense amplifier to reliably amplify small signals.

As with the embodiment of FIG. 8, auto-zero switches 460, 462, 464 and 466 are preferably closed during offset cancellation, and opened after offset cancellation is disabled. Switches 460 and 462 are preferably controlled by NAZ1 470, and switches 464 and 466 are preferably controlled by NAZ2 472. The output of the input offset cancellation amplifier 414 is provided to a latch 416. Latch 416 receives a number or control signals, including CLK-A 480, CLK-B 482, NCLK-B 484 and CLK-C 486, all of which are more fully described below with respect to FIGS. 12–13.

Figure 10:
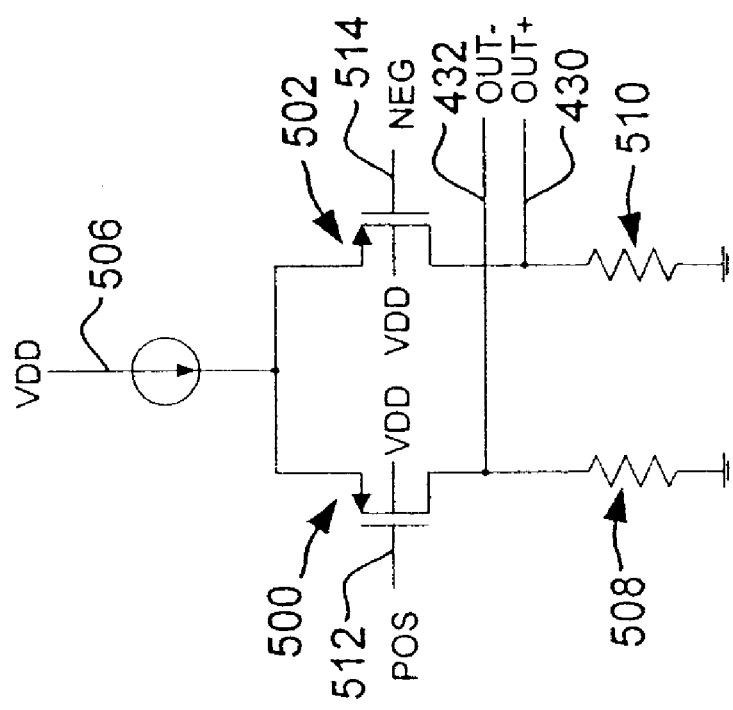
FIG. 10 is a schematic diagram showing the pre-amplifier stage of the sense amplifier of FIG. 9.

FIG. 10 is a schematic diagram showing an illustrative pre-amplifier stage 412 for the sense amplifier of FIG. 9. The illustrative pre-amplifier stage 412 includes two p-channel transistors 500 and 502, a current source 506, and two resistors 508 and 510. The gate of the first p-channel transistor 500 is coupled to the positive input terminal 512 of the pre-amplifier stage 412, and the gate of the second p-channel transistor 502 is coupled to the negative input terminal 514. The source of the first p-channel transistor 500 and the source of the second p-channel transistor 502 are both coupled to the output of current source 506. Thus, the first, p-channel transistor 500 and the second p-channel transistor 502 operate as a current divider.

The drain of the first p-channel transistor 500 is coupled to ground through resistor 508, and the drain of the second p-channel transistor 502 is coupled to ground through resistor 510. If the voltage at the gate of the first p-channel transistor 500 is lower than at the gate of the second p-channel transistor 502, more of the current provided by the current source 506 flows through resistor 508, thereby resulting in a higher voltage on the negative output terminal 432 than on the positive output terminal 430. Likewise, if the voltage at the gate of the first p-channel transistor 500 is higher than voltage at the gate of the second p-channel transistor 502, more of the current provided by the current source 506 flows through resistor 510, thereby resulting in a higher voltage on the positive output terminal 430 than on the negative output terminal 432. The gain of the amplifier may be set by choosing appropriate resistive values for resistors 508 and 510.

Figure 11:
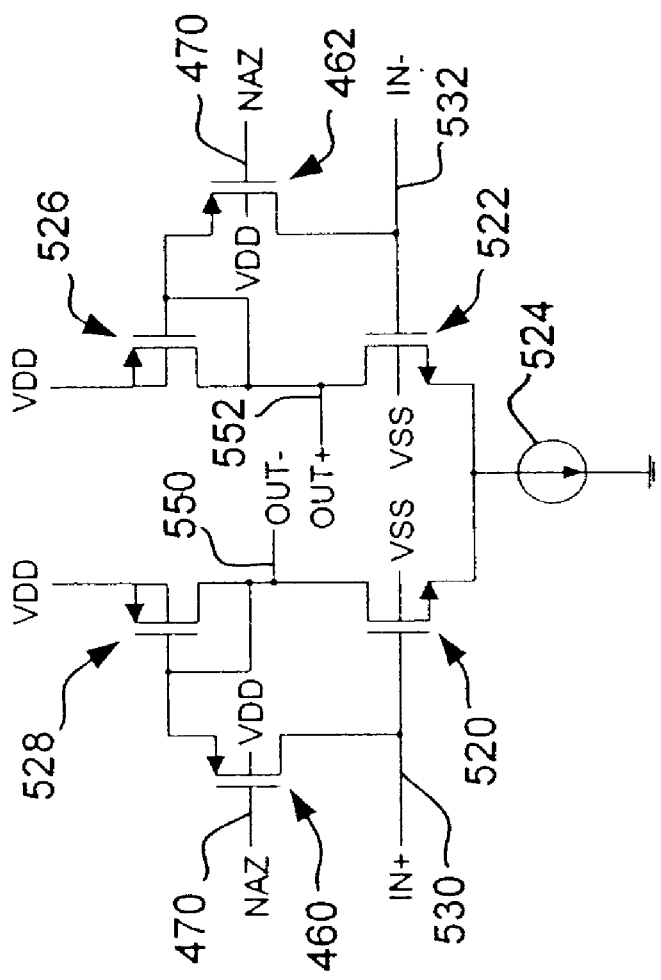
FIG. 11 is a schematic diagram showing one of the offset cancellation amplifier stages of the sense amplifier of FIG. 9.

FIG. 11 is a schematic diagram showing one of the offset cancellation amplifiers stages of the sense amplifier of FIG. 9. The illustrative offset cancellation amplifier stage includes two n-channel transistors 520 and 522, each having a source, a drain and a gate. The gate of n-channel transistor 520 is coupled to the positive input terminal 530, and the gate of n-channel transistor 522 is coupled to the negative input terminal 532. The sources of n-channel transistors 520 and 522 are both coupled to a current source 524. Thus, n-channel transistor 520 and n-channel transistor 522 operate as a current divider.

The drain of n-channel transistor 520 is connected to a p-channel transistor 528, which is configured as a diode load. Likewise, the drain of n-channel transistor 522 is connected to a p-channel transistor 526, which is also configured as a diode load. A first switch, which is implemented as p-channel transistor 460, shorts the negative output terminal 550 to the positive input terminal 530 when NAZ 470 is low. A second switch, which is implemented as p-channel transistor 462, shorts the positive output terminal 552 to the negative input terminal 532 when NAZ 470 is low. The differential gain of the amplifier may be adjusted by controlling the W/L ratios of the n-channel input pair and the p-channel load pair.

Figure 12:
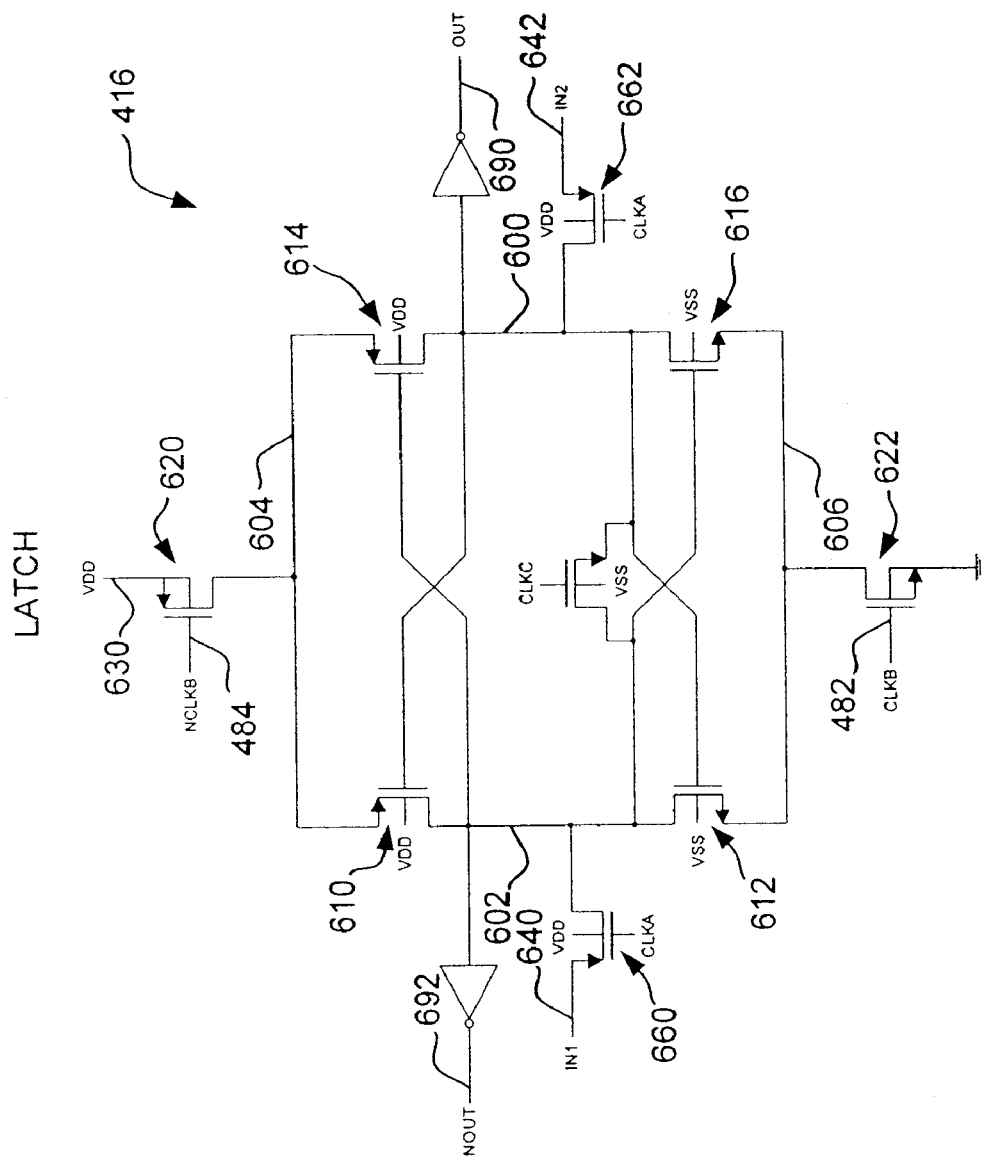
FIG. 12 is a schematic diagram showing an illustrative latch for use with the sense amplifier of FIG. 9.

FIG. 12 is a schematic diagram showing an illustrative latch for use with the sense amplifier of FIG. 9. The latch includes a pair of cross-coupled inverters. A first cross-coupled inverter includes p-channel transistor 610 and n-channel transistor 612 connected in series. The first cross-coupled inverter has an input terminal 600, an output terminal 602, a power supply terminal 604 and a ground terminal 606. A second cross-coupled inverter includes p-channel transistor 614 and n-channel transistor 616 connected in series. The second cross-coupled inverter has an input terminal 602, an output terminal 600, a power supply terminal 604 and a ground terminal 606.

A first switch 620 is provided for selectively disconnecting the power supply terminal 604 from the power supply voltage 630, and a second switch 622 is provided for selectively disconnecting the ground terminal 606 from ground. The first switch 620, which is shown as a p-channel transistor, is controlled by the NCLK-B signal, 484. The second switch 622, which is shown as an n-channel transistor, is controlled by the CLK-B signal. Accordingly, the first switch 620 and the second switch 622 are either both open or both closed.

The illustrative latch further includes a switch 660 for selectively connecting the first input terminal IN1 640 to internal node 602 of the cross-coupled inverters, and another switch 662 for selectively connecting the second input terminal IN2 642 to internal node 600 of the cross-coupled inverters. Switch 660 and switch 662 are selectively enabled to allow the output signal of the sense amplifier of FIG. 9 to set the state of the latch 416. Finally, the illustrative latch includes a reset switch 670 for selectively connecting the output terminals 600 and 602 of the cross-coupled inverters.

During operation, control block 418 of FIG. 9 selectively disconnects the power supply terminal 604 and the ground terminal 606 (collectively called the power supply terminals) the cross-coupled inverters. The control block 418 then enables switches 660 and 662 via the CLK-A signal, which allows the output signal of the sense amplifier to set the voltage levels of internal nodes 600 and 602. The control block 418 then disables switches 660 and 662 to prevent the latch from inadvertently driving the outputs of the sense amplifier when the power supply terminals of the cross-coupled inverters are connected. The control 418 then connects the power supply terminals 604 and 606 of the cross-coupled inverters of the latch 416, which sets the latch 416 to the desired state. The desired state is then read from the latch via outputs terminals 690 and 692. The control block 418 then disconnects the power supply terminals 604 and 606. Finally, the control block 418 resets the state of the latch by selectively connecting the output terminals 600 and 602 of the cross-coupled inverters via the reset switch 670. A further discussion of the operation of the latch is provided below with respect to FIG. 13.

Figure 13:
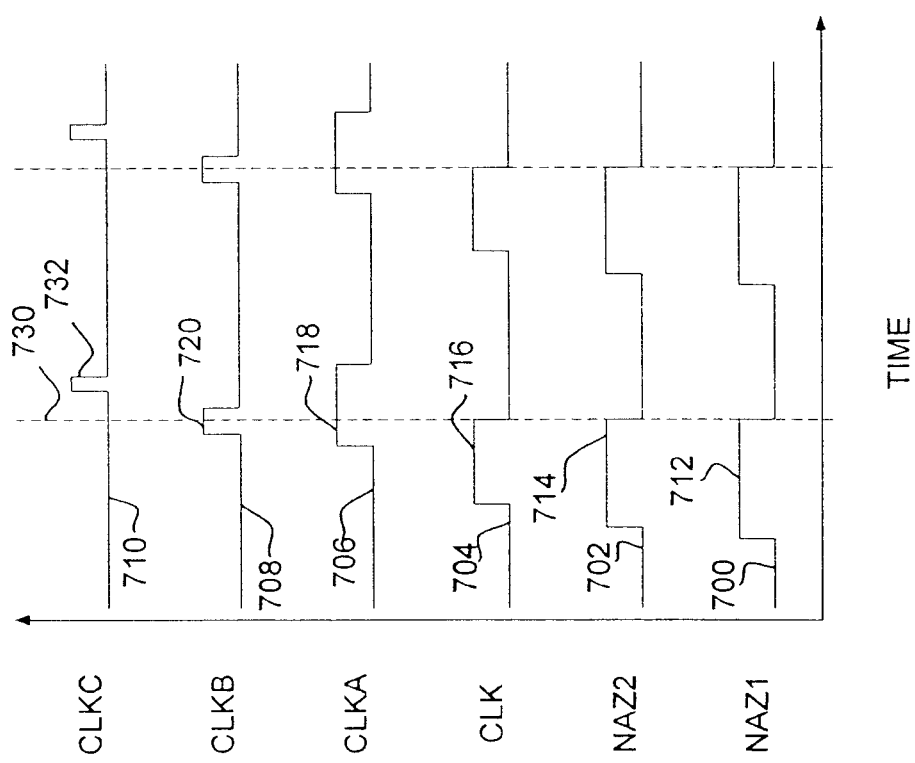
FIG. 13 is an illustrative timing diagram for the sense amplifier of FIG. 9.

FIG. 13 is an illustrative timing diagram for the sense amplifier of FIG. 9. This timing diagram should be read in conjunction with FIGS. 9–12. Initially, NAZ1 470 and NAZ2 472 are low, as shown at 700 and 702. This indicates that the offset cancellation is enabled for each of the stages of the input offset cancellation amplifier 414. The NAZ1 signal 470 and NAZ2 signal 472, when low, close switches 460, 462, 464 and 466 of FIG. 9. As indicated above, switches 460, 462, 464 and 466 connect the input terminals of the corresponding differential amplifiers to the output terminals.

The CLK signal 452 is low and thus NCLK 454 is high, as shown at 704. When CLK 452 is high and NCLK 454 is low, the switch stage 410 changes the polarity of the differential signal received from the first and second bit lines 106a and 106b, before providing the differential signal to the pre-amplifier stage 412. The pre-amplifier stage 412 amplifies the differential signal provided by the switch stage 410, and provides an amplified differential signal to the inputs 430 and 432 of coupling capacitors 434 and 436 of the input offset cancellation amplifier 414.

As such, the inputs 430 and 432 of the first and second coupling capacitors 434 and 436, respectively, are coupled to a differential voltage having the opposite polarity of the differential signal between the first and second bit lines 106a and 106b. This causes the coupling capacitors 434 and 436 to store a charge that not only cancels out the internal offsets of the differential amplifier 428, but also includes a charge that corresponds to the opposite polarity of the desired differential voltage signal.

Control block 418 also sets CLK-A 480, CLK-B 482 and CLK-C 486 low, as shown at 706, 708 and 710, respectively. By setting CLK-A 480 low, the switch transistors 660 and 662 of latch 416 are on, thereby connecting the outputs of the sense amplifier to the internal nodes 600 and 602 of the latch 416. By setting CLK-B 482 low, the switch transistors 620 and 622 of latch 416 are off, which disconnects the power supply terminals 604 and 606 of the latch 416 from the power supply voltage and ground. Finally, by setting CLK-C 486 low, the reset transistor 670 is off.

Once the coupling capacitors are charged, NAZ1 470 and NAZ2 472 are set high, as shown at 712 and 714. This indicates that the offset cancellation is disabled for each of the stages of the input offset cancellation amplifier 414. NAZ1 470 and NAZ2 472 when high, open switches 460, 462, 464 and 466, which disconnect the input terminals of the corresponding differential amplifiers from the output terminals.

The control block 418 then sets CLK 452 high, and thus NCLK 454 low. This is shown at 716. It is contemplated that the control block 418 may set CLK 452 high either before, during, or after NAZ1 470 and NAZ2 472 are set high. In any event, when CLK 452 is low and NCLK 454 is high, the switch stage 410 provides the differential signal received from the first and second bit lines 106a and 106b to the pre-amplifier stage 412. That is, the polarity of the differential signal at the inputs of the coupling capacitors 434 and 436 is reversed. This produces about a two times amplification in the differential voltage signal, as seen at the inputs of the differential amplifier 428, which may further increase the ability of the sense amplifier to reliably amplify small signals. The pre-amplifier stage 412 amplifies the differential signal provided by the switch stage 410, and provides an amplified differential signal to the inputs 430 and 432 of coupling capacitors 434 and 436 of the input offset cancellation amplifier 414.

Because CLK-A 480 remains low, the offset cancellation amplifier 414 is allowed to the set the voltage at internal nodes 600 and 602 of latch 416. Once this is complete, the control block 418 causes CLK-A 480 to go high, as shown at 718. This disconnects the internal nodes 600 and 602 from the sense amplifier. Thereafter, the control block 418 asserts CLK-B 482, as shown at 720. This turns on switches 620 and 622 of latch 416, which connects the power supply terminals 604 and 606 of the latch 416 to the power supply voltage and ground. When power is applied to the latch 416, the latch assumes the desired state.

Thereafter, the state of the latch is read, preferably at time 730. Once read, the control block 418 sets CLK-B 482 low, which turns off switches 620 and 622 of latch 416 and disconnects the power supply terminals 604 and 606 of the latch 416. The control block 418 also sets CLK-A 480 low, which disconnects the internal nodes 600 and 602 from the sense amplifier. Finally, the control block 418 sets CLK-C 486 high, as shown at 732. This turns on reset switch 670. Reset switch 670 shorts the internal nodes 600 and 602 together, thereby setting the latch into a neutral state in preparation for the next read cycle.

Having thus described the preferred embodiments of the present invention, those of skill in the art will readily appreciate that the teachings found herein may be applied to yet other embodiments within the scope of the claims hereto attached.

We claim:

1. A magneto-resistive memory comprising:
   a memory cell configured to provide a differential output signal indicative of a magneto-resistive state of the memory cell;
   a differential amplifier coupled to receive the differential output signal and provide amplified differential output signals on a first output node and a second output node;
   a first capacitor coupled in series with the first output node; and
   a second capacitor coupled in series with the second output node.

2. The memory of claim 1 further comprising a first switch interposed between the first capacitor and the first output node, wherein the first switch can be selectively configured to connect a first reference voltage to the first output node.

3. The memory of claim 2 further comprising a second switch interposed between the second capacitor and the second output node, wherein the second switch can be selectively configured to connect a second reference voltage to the second output node.

4. The memory of claim 1 further comprising a first switch stage interposed between the memory cell and inputs to the differential amplifier.

5. The memory of claim 4 further comprising a second switch stage interposed between the inputs to the differential amplifier and a reference voltage source.

6. The memory of claim 1 further comprising connecting the first and second output nodes to a storage element.

7. A magneto-resistive memory comprising:
   a memory cell configured to provide a first differential output signal indicative of a magneto-resistive state of the memory cell;
   a first differential amplifier with a first input stage coupled to receive the first differential output signal and provide a first amplified differential output signal on a first output stage;
   a first capacitor stage interposed between the memory cell and the first input stage; and
   a second capacitor stage coupled in series with the first output stage.

8. The memory of claim 7 further comprising a second differential amplifier with a second input stage coupled to the second capacitor stage, configured to provide a second amplified differential output signal on a second output stage.

9. The memory of claim 8 further comprising a first switch stage interposed between the memory cell and the first capacitor stage.

10. The memory of claim 9 further comprising a second switch stage, wherein the second switch stage can be selectively configured to connect a first reference voltage to the first capacitor stage.

11. The memory of claim 10 further comprising a third switch stage, wherein the third switch stage can be selectively configured to connect the first input stage to the first output stage.

12. The memory of claim 11 further comprising a fourth switch stage, wherein the fourth switch stage can be selectively configured to connect the second input stage to the second output stage.

13. The memory of claim 12 further comprising a storage element connected to the second output stage.

* * * * *